United States Patent
Nishikawara et al.

(10) Patent No.: US 9,823,562 B2
(45) Date of Patent: Nov. 21, 2017

(54) IMPRINT APPARATUS, IMPRINT METHOD, AND METHOD OF MANUFACTURING ARTICLE

(71) Applicant: CANON KABUSHIKI KAISHA, Tokyo (JP)

(72) Inventors: Tomofumi Nishikawara, Utsunomiya (JP); Kazuki Nakagawa, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 382 days.

(21) Appl. No.: 14/288,435

(22) Filed: May 28, 2014

(65) Prior Publication Data
US 2014/0353865 A1 Dec. 4, 2014

(30) Foreign Application Priority Data

May 30, 2013 (JP) .................................. 2013-114489
Apr. 30, 2014 (JP) .................................. 2014-094047

(51) Int. Cl.
*G03F 7/00* (2006.01)
(52) U.S. Cl.
CPC .................................. *G03F 7/0002* (2013.01)
(58) Field of Classification Search
CPC .................................................... G03F 7/0002
See application file for complete search history.

(56) References Cited

U.S. PATENT DOCUMENTS

| 7,927,089 B2* | 4/2011 | Seki .............. | B82Y 10/00 264/293 |
|---|---|---|---|
| 2005/0046813 A1* | 3/2005 | Streefkerk ........ | G03F 7/70258 355/30 |

FOREIGN PATENT DOCUMENTS

| CN | 101231462 A | 7/2008 |
|---|---|---|
| CN | 101403855 A | 4/2009 |
| CN | 101452207 A | 6/2009 |
| CN | 103048879 A | 4/2013 |
| JP | 2004259985 A | 9/2004 |
| JP | 2013098291 A | 5/2013 |

OTHER PUBLICATIONS

Office Action issued in Korean Appln. No. 10-2014-0061479 dated May 26, 2016.
Office Action issued in Chinese Application No. 201410227985.1 dated May 31, 2017. Translation provided.

* cited by examiner

*Primary Examiner* — Joseph S Del Sole
*Assistant Examiner* — John Robitaille
(74) *Attorney, Agent, or Firm* — Rossi, Kimms & McDowell LLP

(57) ABSTRACT

The present invention provides an imprint apparatus for forming a pattern in a plurality of shot regions on a substrate, comprising a heating unit configured to deform each of the shot regions by heating the substrate, and a control unit configured to control the heating unit, wherein when performing imprint processing for a target shot region as a shot region to undergo imprint processing based on heating control information used to heat, by the heating unit, a shot region which has undergone imprint processing prior to the target shot region, the control unit controls heating of the substrate by the heating unit so that a shape of the target shot region which has been deformed by heating of the substrate according to the control information becomes close to a target shape.

13 Claims, 5 Drawing Sheets

F I G. 4A
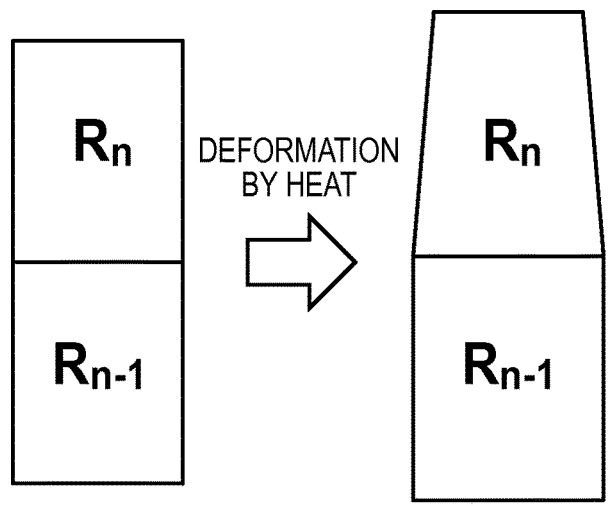
F I G. 4B
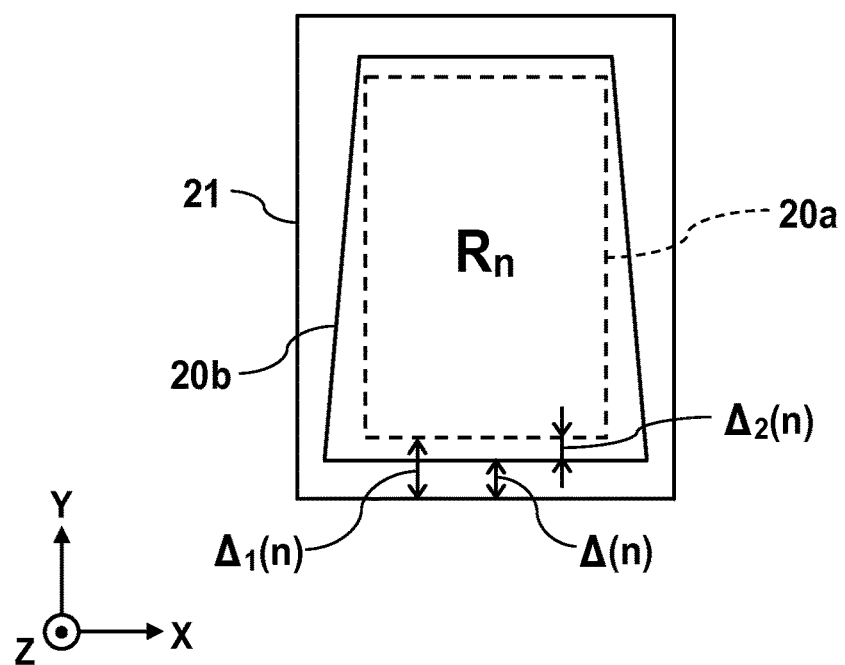

IMPRINT APPARATUS, IMPRINT METHOD, AND METHOD OF MANUFACTURING ARTICLE

BACKGROUND OF THE INVENTION

Field of the Invention

The present invention relates to an imprint apparatus, an imprint method, and a method of manufacturing an article.

Description of the Related Art

An imprint technique of transferring a pattern formed on a mold to an imprint material on a substrate is attracting attention as one of mass-production lithography techniques for magnetic storage media, semiconductor devices, and the like. In an imprint apparatus using such technique, a mold having a pattern formed on it and an imprint material supplied onto a substrate are brought into contact with each other, and the imprint material is cured in this state. The pattern can be formed on the substrate by separating the mold from the cured imprint material.

The manufacture of a semiconductor device or the like requires to overlay patterns of a plurality of layers on a substrate. In an imprint apparatus, therefore, it is important to transfer the pattern of a mold by accurately aligning the pattern with a shot region formed on a substrate. Accordingly, Japanese Patent Laid-Open No. 2004-259985 has proposed a method of deforming a shot region by heating a substrate, and performing alignment between the substrate and a mold.

An imprint apparatus described in Japanese Patent Laid-Open No. 2004-259985 deforms the shot region by heating the substrate when performing alignment between the substrate and the mold. Therefore, the shape of the shot region (target shot region) to undergo imprint processing unwantedly changes due to the influence of heat which has been generated by heating the substrate in the preceding imprint processing and remains in the substrate. As a result, when deforming the shot region by heating the substrate, it can be difficult to perform accurate alignment between the substrate and the mold unless the influence of heat remaining in the substrate is taken into consideration.

SUMMARY OF THE INVENTION

The present invention provides a technique advantageous in performing accurate alignment between a mold and a substrate in an imprint apparatus.

According to one aspect of the present invention, there is provided an imprint apparatus for forming a pattern in a plurality of shot regions on a substrate by performing, at each of the plurality of shot regions, imprint processing of curing an imprint material on the substrate while a mold and the imprint material are in contact with each other, comprising: a heating unit configured to deform each of the shot regions by heating the substrate; and a control unit configured to control the heating unit, wherein when performing imprint processing for a target shot region as a shot region to undergo imprint processing based on heating control information used to heat, by the heating unit, a shot region which has undergone imprint processing prior to the target shot region, the control unit controls heating of the substrate by the heating unit so that a shape of the target shot region which has been deformed by heating of the substrate according to the control information becomes close to a target shape.

Further features of the present invention will become apparent from the following description of exemplary embodiments with reference to the attached drawings.

BRIEF DESCRIPTION OF THE DRAWINGS

FIG. 4A is a view showing the relationship between the shape of a shot region $R_{n-1}$ to undergo (n−1)th imprint processing and that of a shot region $R_n$ (target shot region) to undergo nth imprint processing;

FIG. 4B is a view showing the relationship between the shape of the shot region $R_n$ and a target shape.

DESCRIPTION OF THE EMBODIMENTS

Figure 1:
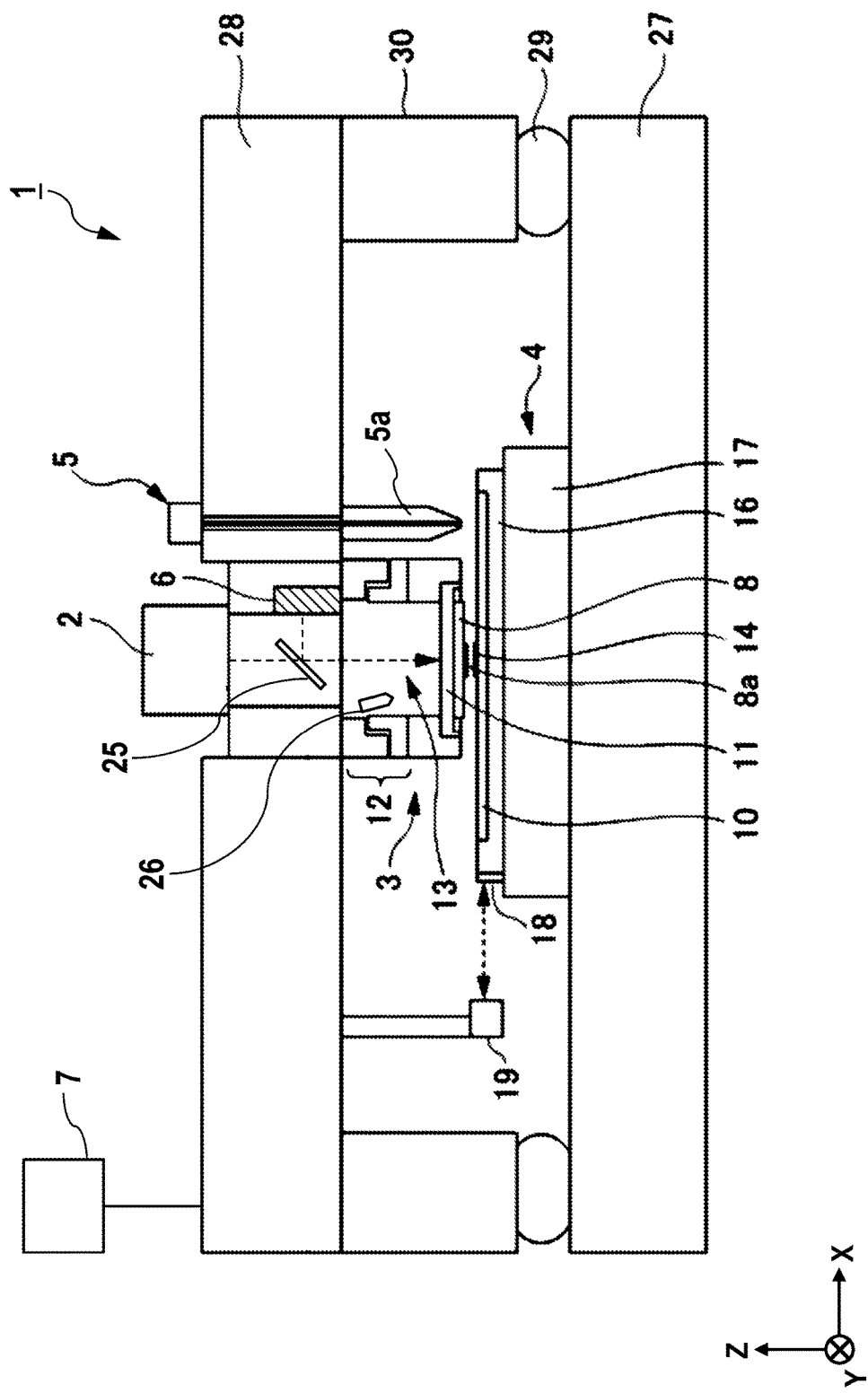
FIG. 1 is a view showing an imprint apparatus according to the first embodiment.

Exemplary embodiments of the present invention will be described below with reference to the accompanying drawings. Note that the same reference numerals denote the same members throughout the drawings, and a repetitive description thereof will not be given. Also, assume that directions which are perpendicular to each other on a substrate surface will be defined as X and Y directions, respectively, and a direction perpendicular to the substrate surface will be defined as a Z direction in the respective drawings.

<First Embodiment>

An imprint apparatus 1 according to the first embodiment of the present invention will be described with reference to FIG. 1. The imprint apparatus 1 is used to manufacture a semiconductor device or the like, and cures an imprint material (resin) on a substrate while a mold 8 having a pattern formed on it is in contact with the imprint material. The imprint apparatus 1 can transfer the pattern of the mold 8 onto the substrate by widening the spacing between a substrate 10 and the mold 8 and separating the mold 8 from the cured imprint material. Examples of a method of curing an imprint material are a heat cycle method using heat and a photo-curing method using light. The imprint apparatus 1 of the first embodiment adopts the photo-curing method. The photo-curing method is a method of curing an ultraviolet-curing resin (to be referred to as a resin 14 hereinafter) by supplying the uncured resin 14 as the imprint material onto a substrate, and irradiating the resin 14 with ultraviolet rays while the mold 8 and the resin 14 are in contact with each other. After the resin 14 is cured by ultraviolet irradiation, a pattern can be formed on the substrate by separating the mold 8 from the resin 14.

FIG. 1 is a view showing the imprint apparatus 1 according to the first embodiment. The imprint apparatus 1 includes a mold holding unit 3, a substrate stage 4, an exposure unit 2, a heating unit 6, a resin supply unit 5, a stage position measurement unit 19, and an alignment measurement unit 26. The imprint apparatus 1 also includes a control unit 7 for controlling imprint processing (controlling each unit of the imprint apparatus 1). The control unit 7 is formed by a computer including a CPU and a memory, and can be connected to each unit of the imprint apparatus 1 via a line to control the unit according to a program and the like. The mold holding unit 3 is fixed to a bridge plate 28 supported by a base plate 27 via an antivibrator 29 and column 30. The substrate stage 4 is fixed to the base plate 27. The antivibrator 29 controls vibrations transmitted from a floor, on which the imprint apparatus 1 is installed, to the bridge plate 28.

The mold 8 is generally made of a material such as quartz capable of transmitting ultraviolet rays. A projection-and-recess pattern to be transferred to the substrate 10 is formed in a partial region (pattern region 8a) of the substrate-side surface of the mold 8. Furthermore, a cavity (concave portion) may be formed by recessing a surface on the opposite side of the substrate-side surface of the mold 8 so as to reduce the thickness of a portion around the pattern region 8a. By having such cavity and reducing the thickness of the portion around the pattern region 8a, it is possible to deform the pattern region 8a into a convex shape toward the substrate 10 when increasing the pressure of an opening region 13 (to be described later).

The mold holding unit 3 includes a mold chuck 11 for holding the mold 8 by, for example, a vacuum suction force or an electrostatic force, and a mold driving unit 12 for driving the mold chuck 11 in the Z direction. Each of the mold chuck 11 and mold driving unit 12 has the opening region 13 in its central portion (interior), and is configured so that the substrate 10 is irradiated, through the mold 8, with light emitted by the exposure unit 2 and heating unit 6. A light-transmitting member (for example, a glass plate (not shown)) may be arranged in the opening region 13 so that a space defined by part of the opening region 13 and the cavity formed in the mold 8 serves as a sealed space. If such light-transmitting member is arranged, a pressure regulation unit (not shown) is connected, via a pipe, to the space sealed by the light-transmitting member, and regulates the pressure within the space. When, for example, the mold 8 and the resin 14 on the substrate are brought into contact with each other, the pressure regulation unit sets the pressure within the space to be higher than the external pressure, thereby deforming the pattern region 8a on the mold into a convex shape toward the substrate 10. This can bring the pattern region 8a into contact with the resin 14 on the substrate outward from the central portion of the pattern region 8a, thereby suppressing air bubbles trapped in the pattern of the mold 8. As a result, it is possible to prevent loss of the pattern transferred onto the substrate.

At this time, deformation including components such as a magnification component, trapezoid component, and parallelogram component may have occurred in the pattern region 8a on the mold due to a manufacturing error or heat deformation. The mold holding unit 3 includes a deformation unit 15 for deforming the mold 8 by applying a force to each of a plurality of portions on the side surface of the mold 8. When the mold holding unit 3 includes the deformation unit 15 as described above, it is possible to deform the pattern region 8a on the mold so that the difference between the shape of the pattern region 8a and the target shape falls within a tolerance range.

The mold driving unit 12 includes, for example, an actuator such as a linear motor or air cylinder, and drives the mold chuck 11 (mold 8) in the Z direction to bring the mold 8 and the resin 14 on the substrate into contact with each other or separate them from each other. Since the mold driving unit 12 is required to perform alignment with high accuracy when the mold 8 and the resin 14 on the substrate are brought into contact with each other, it may be formed by a plurality of driving systems including a coarse driving system and fine driving system. In addition to the function of driving the mold in the Z direction, the mold driving unit 12 may have a position adjustment function of adjusting the position of the mold 8 in the X and Y directions and a ωZ direction (a rotation direction about the Z-axis), a tilt function of correcting the tilt of the mold 8, and the like. Although an operation of changing the distance between the mold 8 and the substrate 10 is performed by the mold driving unit 12 in the imprint apparatus 1 of the first embodiment, it may be performed by a stage driving unit 17 of the substrate stage 4 or by both of the mold driving unit 12 and the stage driving unit 17 relative to each other.

As the substrate 10, for example, a single-crystal silicon substrate, SOI (Silicon on Insulator) substrate, or the like is used. The resin supply unit 5 (to be described later) supplies the resin 14 (ultraviolet-curing resin) to the upper surface (processed surface) of the substrate 10.

The substrate stage 4 includes a substrate holding unit 16 and the stage driving unit 17, and drives the substrate 10 in the X and Y directions. The substrate holding unit 16 holds the substrate 10 by, for example, a vacuum suction force or an electrostatic force. The stage driving unit 17 mechanically holds the substrate holding unit 16, and drives the substrate holding unit 16 (substrate 10) in the X and Y directions. As the stage driving unit 17, for example, a linear motor or planar motor may be used. The stage driving unit 17 may be formed by a plurality of driving systems including a coarse driving system and fine driving system. Also, the stage driving unit 17 may have a driving function of driving the substrate 10 in the Z direction, a position adjustment function of adjusting the position of the substrate 10 by rotating the substrate 10 in the ωZ direction, a tilt function of correcting the tilt of the substrate 10, and the like.

The stage position measurement unit 19 includes, for example, a laser interferometer and an encoder, and measures the position of the substrate stage 4. A case in which the stage position measurement unit 19 includes a laser interferometer will be described. The laser interferometer emits a laser beam toward a reflecting plate 18 arranged on a side surface of the substrate stage 4, and detects a displacement from a reference position on the substrate stage based on the laser beam reflected by the reflecting plate 18. This enables the stage position measurement unit 19 to decide the current position of the substrate stage 4 based on the displacement detected by the laser interferometer. The stage position measurement unit 19 can include one or more laser interferometers for detecting a displacement in each of the X, Y, and Z directions of the substrate stage 4. In this case, the substrate stage 4 includes a reflecting plate 18 to correspond to each laser interferometer. This enables the stage position measurement unit 19 to measure positions in the X, Y, Z, ωX (a rotation direction about the X-axis), ωY (a rotation direction about the Y-axis), and ωZ directions of the substrate stage 4.

The alignment measurement unit 26 is arranged in the opening region 13 of the mold holding unit 3, and measures a shape in each of a plurality of shot regions formed on the substrate. As a method of measuring the shape in each of the plurality of shot regions, a plurality of alignment marks formed in each shot region are detected. For example, alignment marks are formed at the four corners of each shot region, and it is possible to measure the shape in each of the plurality of shot regions by detecting the alignment marks of the shot region. The alignment measurement unit 26 may measure a shape difference indicating the difference between the shape of the pattern region 8a on the mold and that of the shot region on the substrate. The alignment measurement unit 26 detects a plurality of alignment marks formed in each of the pattern region 8a and the shot region. The alignment marks of the pattern region 8a and those of the shot region are formed so that they overlap each other when the pattern region 8a and the shot region coincide with each other in the X and Y directions. For each of the plurality of alignment marks of the pattern region 8a, the alignment measurement unit 26 arranged in the opening region 13 detects a positional shift amount between the alignment mark of the pattern region 8a and a corresponding one of the alignment marks of the shot region. This enables the alignment measurement unit 26 to measure the shape difference between the pattern region 8a and the shot region.

At this time, deformation including components such as a magnification component, trapezoid component, and parallelogram component may have occurred in the shot region on the substrate due to the influence of a series of semiconductor device manufacturing steps and the like. In this case, to accurately transfer the pattern of the mold 8 to the shot region on the substrate, it is necessary to deform the shot region to conform to the shape of the pattern region 8a deformed by the deformation unit 15. That is, when the deformation unit 15 deforms the shape of the pattern region 8a into the target shape, it is necessary to correct the shape of the shot region to be closer to the target shape. To do this, the imprint apparatus 1 of the first embodiment includes the heating unit 6 which heats the substrate 10 by irradiating the substrate 10 with light, and deforms the shot region, as will be described later.

Figure 2:
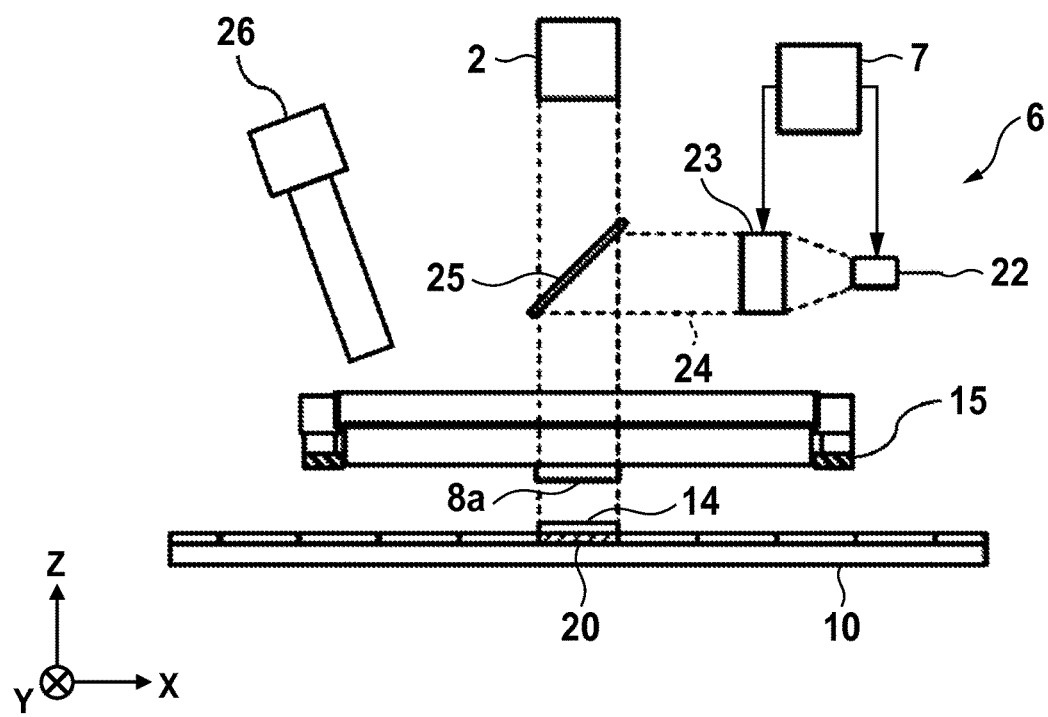
FIG. 2 is a view for explaining the configuration and arrangement of an exposure unit and heating unit.

The exposure unit 2 emits light for curing the resin 14 on the substrate, and the heating unit 6 emits light for heating the substrate 10. An optical member 25 guides the light emitted by the exposure unit 2 and that emitted by the heating unit 6 onto the substrate. The configuration and arrangement of the exposure unit 2 and heating unit 6 will be explained with reference to FIG. 2. FIG. 2 is a view for explaining the configuration and arrangement of the exposure unit 2 and heating unit 6. The exposure unit 2 can include a light source which emits light (ultraviolet rays) for curing the resin 14 on the substrate, and an optical system which shapes the light emitted by the light source into light appropriate for imprint processing. The heating unit 6 can include a light source 22 which emits light for heating the substrate 10, and a light adjustment unit 23 for adjusting the intensity of the light emitted by the light source 22. The heating unit 6 is configured to emit light 24 having a specific wavelength appropriate for heating the substrate 10 without curing the resin 14 supplied onto the substrate. As a method of causing the heating unit 6 to emit the light 24 having a specific wavelength, for example, the light source 22 of the heating unit 6 may be caused to directly emit light having the specific wavelength or an optical filter for transmitting only light having the specific wavelength may be arranged at the succeeding stage of the light source 22 of the heating unit 6. The light adjustment unit 23 of the heating unit 6 adjusts the intensity of light with which the substrate 10 is irradiated so that a temperature distribution in the shot region becomes a desired temperature distribution. As the light adjustment unit 23 of the heating unit 6, for example, a liquid crystal device, DMD (digital mirror device), and the like can be adopted. The liquid crystal device can change the intensity of light with which the substrate 10 is irradiated, by arranging a plurality of liquid crystal elements on a light-transmitting plane, and separately controlling voltages respectively applied to the plurality of liquid crystal elements. The digital mirror device can change the intensity of light with which the substrate 10 is irradiated, by arranging a plurality of mirror elements on a light-reflecting plane, and independently adjusting the plane direction of each mirror element. The optical member 25 can include, for example, a beam splitter which transmits light (ultraviolet rays) emitted by the exposure unit 2 and reflects the light 24 emitted by the heating unit 6.

The resin supply unit 5 supplies (applies) the resin 14 (uncured resin) onto the substrate via a discharge nozzle 5a. As described above, in the first embodiment, an ultraviolet-curing resin (imprint material) having a property that is cured upon ultraviolet irradiation is used. The resin 14 to be supplied from the discharge nozzle 5a of the resin supply unit 5 onto the substrate can be appropriately selected under various conditions in semiconductor device manufacturing steps. The amount of the resin discharged from the discharge nozzle 5a of the resin supply unit 5 can be appropriately decided in consideration of the thickness of the pattern to be formed on the resin 14 on the substrate, the density of the pattern, and the like. To sufficiently fill the pattern formed on the mold 8 with the resin 14 supplied onto the substrate, a given time may elapse while the mold 8 and resin 14 are in contact with each other.

Figure 3:
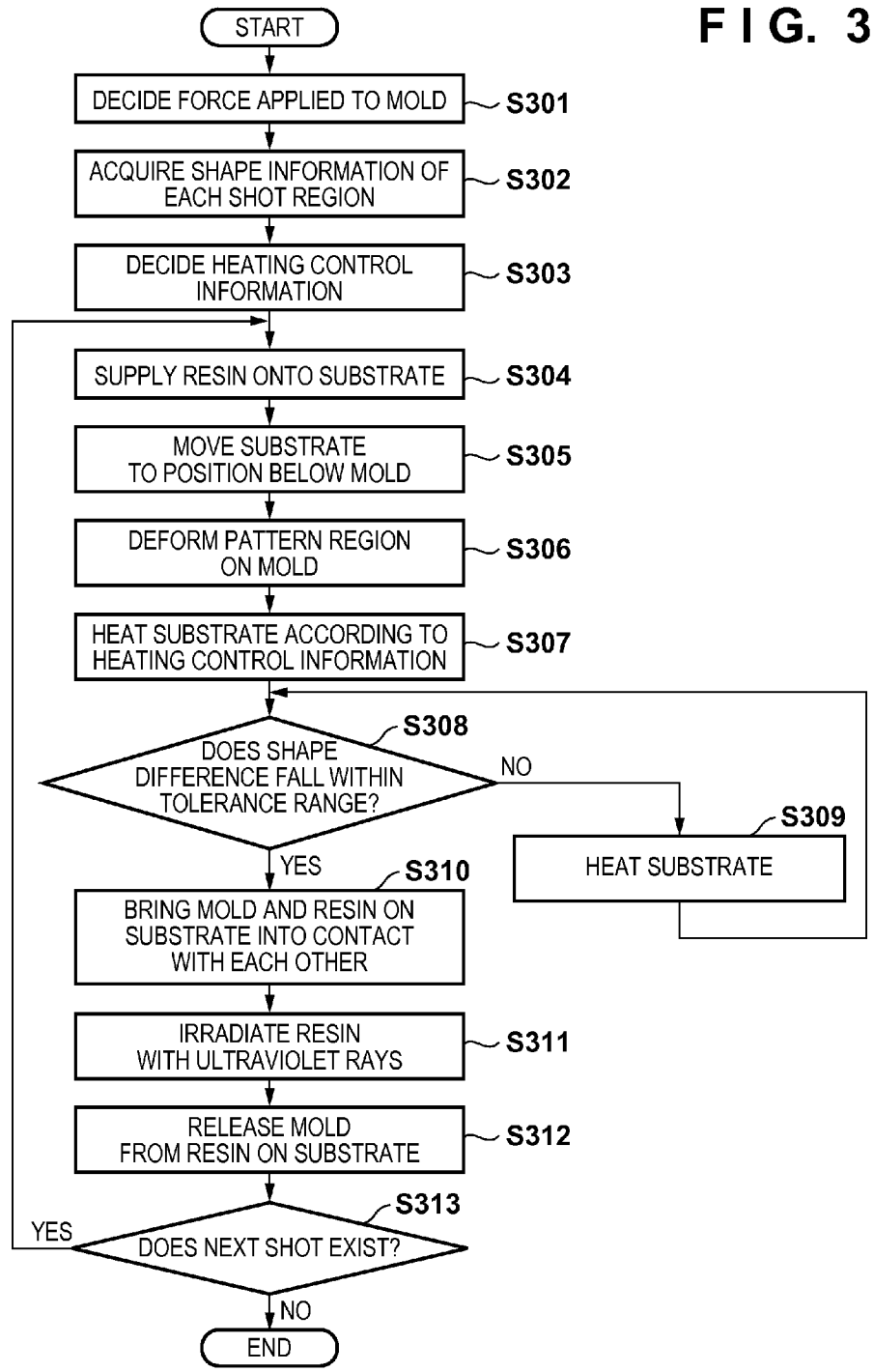
FIG. 3 is a flowchart illustrating an operation sequence in imprint processing.

As described above, the imprint apparatus 1 of the first embodiment includes the heating unit 6, and deforms the shot region on the substrate so that the difference between the shape of the shot region and the target shape falls within the tolerance range by causing the heating unit 6 to irradiate the substrate 10 with light and apply heat to the substrate 10. Imprint processing of transferring the pattern of the mold 8 to each of the plurality of shot regions on the substrate in the imprint apparatus 1 of the first embodiment will be described with reference to FIG. 3. FIG. 3 is a flowchart illustrating an operation sequence in the imprint processing of transferring the pattern of the mold 8 to each of the plurality of shot regions on the substrate.

In step S301, the control unit 7 causes the alignment measurement unit 26 to measure the shape of the pattern region 8a on the mold, and decides a force (deformation amount) applied to the mold 8 by the deformation unit 15 so that the difference between the shape of the pattern region 8a and the target shape falls within the tolerance range. As the target shape, for example, a shape and dimensions in the design data of the pattern region 8a are applicable. The present invention, however, is not limited to them, and the target shape is arbitrarily settable. For example, an intermediate shape between the shape of the pattern region 8a on the mold and that of the shot region on the substrate may be set as the target shape.

In step S302, the control unit 7 acquires shot region shape information measured for each of the plurality of shot regions formed on the substrate (acquires pieces of shape information for all the shot regions formed on the substrate). The above-described alignment measurement unit 26 can measure the shot region shape information when, for example, the substrate 10 is arranged within the imprint apparatus 1, that is, before the imprint processing starts for the substrate 10. Alternatively, a measurement apparatus arranged outside the imprint apparatus 1 may measure the shot region shape information before the substrate 10 is arranged within the imprint apparatus. In step S303, the control unit 7 decides control information of heating by the heating unit 6 for each of the plurality of shot regions on the substrate using the shot region shape information acquired in step S302 so that the difference between the shape of the shot region and the target shape falls within the tolerance range. The heating control information in each shot region can contain information about a heat quantity applied to each of a plurality of portions on the substrate so that a temperature distribution which makes the difference between the shape of the shot region and the target shape fall within the tolerance range occurs in the shot region.

In step S304, the control unit 7 controls the stage driving unit 17 so that a target shot region 20 as a shot region to undergo the imprint processing is arranged below the discharge nozzle 5a of the resin supply unit 5. The control unit 7 then controls the resin supply unit 5 to supply the resin 14 (uncured resin) to the target shot region 20. In step S305, the control unit 7 controls the stage driving unit 17 so that the target shot region 20 supplied with the resin 14 is arranged below the pattern region 8a on the mold. In step S306, the control unit 7 controls the deformation unit 15 based on the deformation amount decided in step S301 to deform the pattern region 8a on the mold. In step S307, the control unit 7 controls the heating unit 6 based on the heating control information decided in step S303 to deform the target shot region 20.

In step S308, the control unit 7 causes the alignment measurement unit 26 to measure the shape difference between the pattern region 8a and the target shot region 20, and determines whether the measured shape difference falls within the tolerance range. If the shape difference measured by the alignment measurement unit 26 falls outside the tolerance range, the process advances to step S309. On the other hand, if the shape difference measured by the alignment measurement unit 26 falls within the tolerance range, the process advances to step S310. In step S309, the control unit 7 decides a heat quantity to be applied to each of the plurality of portions on the substrate by the heating unit 6 so that the shape difference measured by the alignment measurement unit 26 in step S308 falls within the tolerance range, and controls the heating unit 6 based on the heat quantity. After deforming the target shot region 20 by controlling the heating unit 6, the process returns to step S308 to determine again whether the shape difference between the pattern region 8a and the target shot region 20 falls within the tolerance range.

In step S310, the control unit 7 controls the mold driving unit 12 to bring the mold 8 into contact with the resin 14 on the substrate. In step S311, the control unit 7 controls the exposure unit 2 to irradiate, with ultraviolet rays, the resin 14 which is in contact with the mold 8, thereby curing the resin. In step S312, the control unit 7 controls the mold driving unit 12 to separate (release) the mold 8 from the resin 14 on the substrate. In step S313, the control unit 7 determines whether there exists a shot region (next shot region) on the substrate, to which the pattern of the mold 8 is to be subsequently transferred. If there exists a next shot region, the process returns to step S303; otherwise, the imprint processing for the one substrate 10 ends.

As described above, in the imprint apparatus 1 of the first embodiment, to transfer the pattern of the mold 8 to each of the plurality of shot regions on the substrate, steps S304 to S313 are repeated. If, therefore, there is a shot region having undergone the imprint processing prior to the target shot region 20 to undergo the imprint processing, the heating unit 6 has already heated the substrate 10 at the time of starting the imprint processing of the target shot region 20. In this case, heat applied to the substrate 10 prior to the imprint processing of the target shot region 20 remains in the substrate 10 while being transferred to the target shot region 20. As a result, the shape of the target shot region 20 may change. That is, heat applied to the substrate 10 prior to the imprint processing of the target shot region 20 may deform the target shot region 20. Therefore, when deforming the target shot region 20 by heating the substrate 10, it may be difficult to perform accurate alignment between the mold 8 and the substrate 10 unless the influence of heat remaining in the substrate 10 is taken into consideration. This problem will be described with reference to FIGS. 4A and 4B. FIG. 4A is a view showing the relationship between the shape of a shot region $R_{n-1}$ to undergo (n-1)th imprint processing and that of a shot region $R_n$ (target shot region 20) to undergo nth imprint processing. FIG. 4B is a view showing the relationship between the shape of the shot region $R_n$ and the target shape. Before heating the substrate 10, the shot regions $R_n$ and $R_{n-1}$ have the same dimension in the X direction and are adjacent to each other in the Y direction, as shown in the left portion of FIG. 4A.

When, for example, the heating unit 6 heats the substrate 10 to perform magnification correction for the shot region $R_{n-1}$, heat applied to the substrate 10 by the heating unit 6 is also transferred to the shot region $R_n$. The shot region $R_n$ may be deformed into a trapezoid along with deformation of the shot region $R_{n-1}$, as shown in the right portion of FIG. 4A. That is, as shown in FIG. 4B, the shot region $R_n$ (target shot region 20) is deformed from a shape 20a to a shape 20b, the difference (correction amount $\Delta(n)$) between the shot region $R_n$ and a target shape 21 is represented by $\Delta_1(n)-\Delta_2(n)$. In the imprint apparatus 1 of the first embodiment, therefore, the control unit 7 decides heating control information in each shot region in consideration of the influence of heat remaining in the substrate in step S303 of FIG. 3. Note that $\Delta_1(n)$ indicates the difference (shape difference) between the shape 20a of the shot region $R_n$ and the target shape 21 before deformation, and $\Delta_2(n)$ indicates the difference between the shape 20a of the shot region $R_n$ before deformation and the shape 20b of the shot region $R_n$ after deformation, that is, the deformation amount of the shot region $R_n$ due to the influence of heat applied to the substrate 10 to deform the shot region $R_{n-1}$. For the sake of descriptive convenience, in FIG. 4B, the shot region $R_n$ is deformed from the shape 20a to the shape 20b with reference to its center. Only a shift of a side in the Y direction has been explained. In fact, however, a shift or deformation of each side can be considered.

Figure 5:
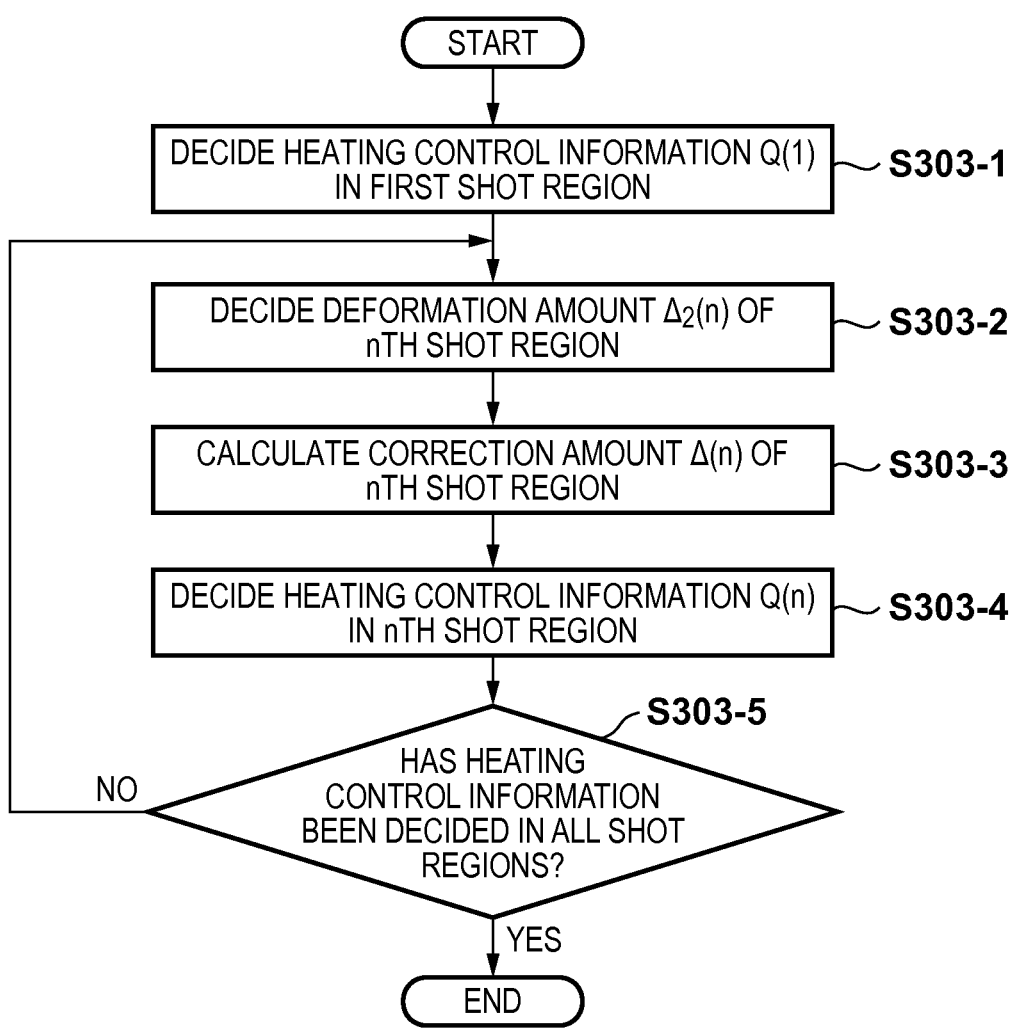
FIG. 5 is a flowchart illustrating a method of deciding a heat quantity in each shot region in consideration of the influence of heat remaining in the substrate.

A method in which the control unit 7 decides heating control information in each shot region in consideration of the influence of heat remaining in the substrate 10 will be described with reference to FIG. 5. FIG. 5 is a flowchart illustrating a method of deciding heating control information in each shot region in consideration of the influence of heat remaining in the substrate, which can be executed in step S303 of FIG. 3.

In step S303-1, the control unit 7 calculates heating control information Q(1) in a shot region (first shot region) which undergoes the imprint processing first. In the first shot region, the heating unit 6 has performed no heating before the imprint processing. The heating control information Q(1) in the first shot region is decided based on only the shape of the first shot region acquired in step S302. That is, the heating control information Q(1) in the first shot region is decided so that a shape difference $\Delta_1(1)$ between the target shape and the shape of the first shot region acquired in step S302 falls within the tolerance range.

In step S303-2, the control unit 7 decides the deformation amount $\Delta_2(n)$ indicating the amount of deformation of the nth shot region due to the influence of heat remaining in the substrate 10 in the shot region (nth shot region) to undergo the nth imprint processing. The deformation amount $\Delta_2(n)$ of the nth shot region is decided based on the control information of heating by the heating unit 6 in each shot region which has undergone the imprint processing prior to that of the nth shot region.

In step S303-3, the control unit 7 decides the shape difference $\Delta_1(n)$ between the target shape and the shape of the nth shot region acquired in step S302, and calculates the difference between the shape difference $\Delta_1(n)$ and the deformation amount $\Delta_2(n)$ as the correction amount $\Delta(n)$ of the nth shot region. In step S303-4, the control unit 7 decides the heating control information Q(n) in the nth shot region so that the correction amount $\Delta(n)$ of the nth shot region falls within the tolerance range. The heating control information Q(n) in the nth shot region can be decided based on, for example, the heat transfer model of the substrate 10 and its surrounding members (for example, the substrate holding unit). When deciding the heating control information Q(n) by calculation, for example, an optimization problem in which the correction amount $\Delta(n)$ of the nth shot region is used as an objective function and the heating control information Q(n) of the nth shot region is used as a variable is considered. It is possible to decide the heating control information Q(n) by solving the optimization problem so that the correction amount $\Delta(n)$ falls within a tolerance range $\epsilon$. Furthermore, the heating control information Q(n) may be decided by experiment. Among a plurality of substrates 10 conveyed to the imprint apparatus 1 through the same manufacturing steps, almost the same deformation has often occurred in a pattern formed in each substrate 10. By preparing the substrate 10 (for example, a dummy substrate) through the same manufacturing steps, and causing the heating unit 6 to heat the substrate 10 while changing a heat quantity, the heat quantity when the correction amount $\Delta(n)$ falls within the tolerance range $\epsilon$ is acquired. The control unit can decide the heating control information Q(n) in the nth shot region at the time of the imprint processing by creating, in advance, a database of the relationship between the nth shot region and the heating control information Q(n).

In step S303-5, the control unit 7 determines whether heating control information has been decided in all the shot regions on the substrate. If heating control information has been decided in all the shot regions, the process advances to step S304; otherwise, the process returns to step S303-2. As described above, in step S303, the control unit 7 can decide heating control information in all the shot regions on the substrate in consideration of the influence of heat remaining in the substrate. The imprint apparatus 1 of the first embodiment performs imprint processing for each shot region based on the heating control information decided in step S303. Therefore, for example, a step of advancing to step S309 according to the determination by the control unit 7 in step S308 of FIG. 3 can be omitted or the number of times the step is performed can be decreased. As a result, it is possible to improve the throughput (productivity) of the imprint apparatus 1.

Note that a heat quantity in each shot region may be weighted according to the elapsed time from when the heating unit 6 performs heating or the distance between the shot region and the nth shot region (a position on the substrate, which has been heated by the heating unit 6). For example, a deformation amount $\Delta_2(3)$ in a shot region (third shot region) to undergo the third imprint processing is decided based on the heating control information Q(1) in the first shot region and heating control information Q(2) in a second shot region. For the first and second shot regions, the times when the heating unit 6 performs heating and the distances to the third shot region are different. Therefore, the heating of the first shot region and that of the second shot region have different influences on the third shot region. The deformation amount $\Delta_2(3)$ in the third shot region can be decided based on the pieces Q(1) and Q(2) of heating control information which have been weighted according to the elapsed times from when the heating unit 6 performs heating or the positions on the substrate.

As described above, when performing alignment between the pattern region 8a and a shot region, the imprint apparatus 1 of the first embodiment deforms the shot region by causing the heating unit 6 to heat the substrate 10 so that the shape of the shot region becomes close to the target shape. The imprint apparatus 1 then decides heating control information to be used to deform the shot region by causing the heating unit 6 to heat the substrate 10 in consideration of the influence of heat remaining in the substrate 10. When the control unit 7 controls the heating unit 6 based on the thus decided heating control information, it is possible to perform accurate alignment between the mold 8 and the substrate 10.

<Second Embodiment>

An imprint apparatus according to the second embodiment of the present invention will be described. A method of deciding heating control information in each shot region in the imprint apparatus of the second embodiment is different from that in the imprint apparatus 1 of the first embodiment. In the second embodiment, a method of deciding heating control information Q(n) in an nth shot region (corresponding to step S303-4 of FIG. 5) will be explained below. In the second embodiment, the heating control information Q(n) in the nth shot region is decided by decomposing a correction amount $\Delta(n)$ of the nth shot region into a plurality of types of deformation components, and combining heating distributions for correcting the respective deformation components. The apparatus arrangement of the imprint apparatus of the second embodiment is the same as that of the imprint apparatus 1 of the first embodiment, and a description thereof will be omitted.

The method of deciding the heating control information Q(n) in the nth shot region will be explained below. As described above, the correction amount $\Delta(n)$ of the nth shot region is represented by $\Delta_1(n)-\Delta_2(n)$. The heating unit is controlled according to the heating control information Q(n). Let $\Delta_Q(n)$ be the deformation amount of the nth shot region when heating the substrate. Then, $$|\Delta_1(n)-\Delta_2(n)-\Delta_Q(n)|<\epsilon \quad (1)$$

where $\epsilon$ represents the tolerance range of a correction residual in the shape of the nth shot region deformed by applying the heat quantity Q(n) to the substrate 10.

Decomposing the shape difference $\Delta_1(n)$ and the deformation amounts $\Delta_2(n)$ and $\Delta_Q(n)$ into a plurality of types of deformation components yields inequality (2) below. Note that the plurality of types of deformation components are represented by $\delta i$ (i=1, 2, 3, . . . ) in inequality (2), and include, for example, a magnification component, trapezoid component, and parallelogram component. The coefficients ai, bi, and ci are expansion functions by the deformation components $\delta i$ of the shape difference $\Delta_1(n)$ and the deformation amounts $\Delta_2(n)$ and $\Delta_Q(n)$.

$$|\Sigma(ai*\delta i)+\Sigma(bi*\delta i)+\Sigma(ci*\delta i)|<\epsilon \quad (2)$$

In this case, the heating control information Q(n) in the nth shot region need only be obtained so that $\Delta_Q(n)=\Delta(n)=\Delta_1(n)-\Delta_2(n)$ is satisfied, that is, ci=ai−bi is satisfied. As described above, since $\Delta_Q(n)$ corresponds to ci, inequality (2) can be represented by equality (3) below. That is, if a heating distribution Qi for correcting each deformation component $\delta i$ is obtained, the heating control information Q(n) for correcting the deformation amount Δ(n) can be calculating by respectively multiplying the heating distributions Qi by the coefficients and combining the results. The heating distribution Qi can include a heat quantity applied to each of a plurality of portions on the substrate for correcting the deformation component δi. For example, the shape 20b of the shot region $R_n$ shown in FIG. 4B includes a trapezoid component. To change the shape 20b including the trapezoid component into a rectangular shape, it is necessary to set the heating distribution so that the heat quantity by the heating unit 6 increases in the +Y direction. That is, the heating distribution Qi for correcting the trapezoid component includes a heat quantity applied to each of a plurality of portions on the substrate for correcting the trapezoid component. The heating distribution Qi for correcting the deformation component δi may be calculated in advance based on a heat transfer model, or obtained in advance by experiment, as described in the first embodiment. This makes it possible to obtain the control information Q(n) of heat applied to the substrate 10 to correct the nth shot region by the correction amount Δ(n) in accordance with equation (4) below. That is, it is possible to decide the heating control information Q(n) in the nth shot region by respectively multiplying the heating distributions Qi for correcting the respective deformation components δi by the coefficients, and combining the results.

$$\Delta_Q(n) = \Sigma((ai+bi)*\delta i) \quad (3)$$

$$Q(n) = \Sigma((ai+bi)*Qi) \quad (4)$$

As described above, the imprint apparatus of the second embodiment decomposes the correction amount Δ(n) in the nth shot region into a plurality of types of deformation components δi, multiplies the heating distributions Qi for correcting the respective deformation components δi by the coefficients, and combines the results. This makes it possible to decide the heating control information Q(n) in the nth shot region. As described above, when the method of decomposing the correction amount Δ(n) into the plurality of deformation components δi is used to decide the heating control information Q(n), the calculation scale in the control unit 7 can be made small, as compared with the imprint apparatus 1 of the first embodiment. Furthermore, similarly to the imprint apparatus 1 of the first embodiment, it is possible to improve the throughput (productivity) of an imprint apparatus 1 while performing accurate alignment between a mold 8 and a substrate 10.

<Third Embodiment>

An imprint apparatus according to the third embodiment of the present invention will be described. A method of deciding heating control information (including a heat quantity) in each shot region in the imprint apparatus of the third embodiment is different from that in the imprint apparatus 1 of the first embodiment. In the third embodiment, a method of deciding heating control information (corresponding to step S303 of FIG. 3) according to the third embodiment will be explained below. In the third embodiment, heating control information in a shot region (the (n−1)th shot region, the (n−2)th shot region, . . . ) undergoing imprint processing before the nth shot region is decided so that the shape of the nth shot region (target shot region) is optimally corrected. That is, heating control information in a shot region undergoing imprint processing before the nth shot region is decided based on information about a deformation amount in the nth shot region, which is generated by heating based on the control information at the time of imprint processing of the nth shot region. Furthermore, heating control information in the nth shot region is decided so that the shape of a shot region (the (n+1)th shot region, the (n+2)th shot region, . . . ) undergoing imprint processing after the nth shot region is optimally corrected. That is, heating control information in the nth shot region is decided based on deformation information about a deformation amount in a shot region undergoing imprint processing after the nth shot region, which is generated by heating based on the control information at the time of imprint processing of the shot region. The apparatus arrangement of the imprint apparatus of the third embodiment is the same as that of the imprint apparatus 1 of the first embodiment, and a description thereof will be omitted.

A method of deciding pieces of heating control information in the nth shot region and shot regions undergoing imprint processing before and after the nth shot region by considering the influence of heating of these shot regions will be explained below. Let $\Delta_Q(n)$ be a deformation amount in the nth shot region when controlling a heating unit according to the control information in the nth shot region. The shape of the nth shot region is corrected to satisfy inequality (5) (where ϵ represents the tolerance range of a correction residual). In inequality (5), $\Delta_1(n)$ represents the shape difference (target deformation amount) between the shape of the nth shot region and a target shape, which can be decided at the start of imprint processing of a substrate 10. Furthermore, $\Delta_2(n)$ represents a deformation amount in the nth shot region by heating each of a plurality of shot regions undergoing imprint processing before the nth shot region (to be referred to as each previous shot region hereinafter). The deformation amount $\Delta_2(n)$ can be divided into a plurality of deformation components $d_n$ ($d_n(n-1)$, $d_n(n-2)$, . . . ) based on heat remaining in the substrate 10 by heating each previous shot region. Therefore, a control unit 7 can adjust the deformation amount $\Delta_2(n)$ by controlling heating of each previous shot region to change each deformation component $d_n$. That is, the control unit 7 optimizes each deformation component $d_n$ of the deformation amount $\Delta_2(n)$ by control information (Q(n−1), Q(n−2), . . . ) in each previous shot region, in addition to optimization of the deformation amount $\Delta_Q(n)$ by controlling control information Q(n). This can further reduce a correction residual generated in the nth shot region. As described above, in the third embodiment, the shape of the nth shot region which is corrected by only changing the control information Q(n) in the nth shot region in the first and second embodiments can also be corrected by changing the deformation $\Delta_2(n)$. The imprint apparatus of the third embodiment can perform alignment between a pattern region 8a of a mold 8 and a shot region more accurately.

$$|\Delta_1(n) - \Delta_2(n) - \Delta_Q(n)| < \epsilon \quad (5)$$

The shape of the (n+1)th shot region undergoing imprint processing next to the nth shot region is corrected so as to satisfy inequality (6). In inequality (6), $\Delta_2(n+1)$ includes a deformation component $d_{n+1}(n)$ generated by heating the nth shot region. The control unit 7, therefore, can decide the control information Q(n) in the nth shot region in consideration of correction of the shape of the (n+1)th shot region as well. This can further reduce a correction residual generated in the (n+1) shot region.

$$|\Delta_1(n+1) - \Delta_2(n+1) - \Delta_Q(n+1)| < \epsilon \quad (6)$$

The deformation amount $\Delta_2(n+1)$ includes a deformation component $d_{n+1}$ ($d_{n+1}(n-1)$, $d_{n+1}(n-2)$, . . . ) generated by heating each shot region undergoing imprint processing before the nth shot region. The control unit 7, therefore, can decide control information (Q(n−1), Q(n−2), . . . ) in each previous shot region in consideration of correction of the shape of the (n+1)th shot region as well. At this time, for example, the control information Q(n) in the nth shot region undergoing imprint processing immediately before the (n+1)th shot region has a larger influence on the deformation amount $\Delta_2(n+1)$ than that of the control information Q(n−1) in the (n−1)th shot region undergoing imprint processing two shot regions before the (n+1)th shot region. Consequently, deciding control information in each previous shot region in consideration of the influence on the deformation amount $\Delta_2(n+1)$ is more effective at reducing the correction residual. However, if the control information Q(n−1) in the (n−1)th shot region is changed to optimize the deformation component $d_{n+1}(n-1)$ of the deformation amount $\Delta_2(n+1)$, the deformation amount $\Delta_Q(n-1)$ may largely deviate from an optimum value. As a result, inequality (7) for correction of the shape of the (n−1)th shot region is not satisfied. To solve this problem, the control unit 7 can optimize the deformation amount $\Delta_Q(n-1)$ and the deformation component $d_n(n-1)$ of the deformation amount $\Delta_2(n)$ by changing the control information Q(n−1), and optimizes the deformation amount $\Delta_Q(n)$ by changing the control information Q(n). In this case, for example, pieces of control information in the (n−1)th shot region and the nth shot region are collectively calculated by simultaneously calculating inequalities (5) and (7). This can reduce the correction residual in the nth shot region, as compared with the conventional example, while a correction residual in each shot region falls within the tolerance range.

$$|\Delta_1(n-1)-\Delta_2(n-1)-\Delta_Q(n-1)|<\epsilon \quad (7)$$

Similarly, the control unit 7 can optimize the deformation amount $\Delta_Q(n-1)$, the deformation component $d_n(n-1)$ of the deformation amount $\Delta_2(n)$, and the deformation amount $d_{n+1}(n-1)$ of the deformation amount $\Delta_2(n+1)$ by controlling the control information Q(n−1) so as to simultaneously satisfy inequalities (5) to (7). The control unit 7 then can optimize the deformation amount $\Delta_Q(n)$ and the deformation amount $d_{n+1}(n)$ of the deformation amount $\Delta_2(n+1)$ by controlling the control information Q(n), and optimizes the deformation amount $\Delta_Q(n+1)$ by controlling the control information Q(n+1). In this case, for example, pieces of control information in the (n−1)th shot region, the nth shot region, and the (n+1)th shot region are collectively calculated by simultaneously calculating inequalities (5) to (7). The number of shot regions for which the influence of heat remaining in the substrate 10 is considered may be arbitrary. If, for example, imprint processing is performed for all the shot regions in an order in which heat remaining in the substrate 10 always influences a shot region to undergo imprint processing next, pieces of control information in all the shot regions may be collectively decided using inequalities (5) to (7). Alternatively, a predetermined number of shot regions included in a range within which heat remaining in the substrate 10 has an influence may be regarded as one group, and pieces of control information in the predetermined number of shot regions included in one group may be collectively decided. As described above, it is possible to improve the accuracy of alignment between the mold 8 and the substrate 10 by collectively controlling pieces of control information in shot regions undergoing imprint processing before and after a target shot region.

<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing an article according to this embodiment includes a step of forming a pattern on a resin applied on a substrate (a step of performing imprint processing on the substrate) by using the above-described imprint apparatus, and a step of processing the substrate on which the pattern is formed in the above step. This manufacturing method further includes other well-known steps (for example, oxidation, film formation, deposition, doping, planarization, etching, resist removal, dicing, bonding, and packaging). When compared to the conventional methods, the method of manufacturing an article according to this embodiment is advantageous in at least one of the performance, quality, productivity, and production cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2013-114489, filed May 30, 2013, and 2014-094047, filed Apr. 30, 2014, which are hereby incorporated by reference herein in their entirety.

What is claimed is:

1. An imprint apparatus for forming a pattern in first and second shot regions on a substrate by performing, at each of the first and second shot regions, imprint processing of forming the pattern of an imprint material on the substrate using a mold, the apparatus comprising:

a heating unit configured to deform each of the first and second shot regions by heating the substrate; and a control unit configured to control the heating unit, wherein the control unit obtains first heating control information for controlling heating of the first shot region by the heating unit and second heating control information for controlling heating of the second shot region by the heating unit, wherein the second heating control information is set using the first heating control information so that the second shot region becomes close to a target shape by deformation of the second shot region by the heating of the first shot region using the first heating control information and deformation of the second shot region by the heating of the second shot region using the second heating control information, wherein the control unit controls heating of the first shot region using the obtained first heating control information and controls the imprint processing of the first shot region deformed by the heating of the first shot region, and wherein the control unit controls heating of the second shot region using the obtained second heating control information and controls the imprint processing of the second shot region deformed by the heating of the first shot region and the heating of the second shot region.

2. The apparatus according to claim 1, wherein based on the first heating control information, the control unit determines a deformation amount of the second shot region, which is caused by heating of the first shot region using the first heating control information, and the control unit determines the shape of the second shot region which has been deformed by heating of the first shot region using the first heating control information, by using the deformation amount and the shape of the second shot region obtained before heating of the first shot region using the first heating control information.

3. The apparatus according to claim 2, wherein the control unit controls heating by the heating unit so that the shape of the second shot region becomes close to the target shape based on a distribution obtained by combining each heating distribution for correcting each of the plural types of deformation components of a shape difference indicating a difference between the target shape and the shape of the second shot region deformed by heating of the first shot region using the first heating control information.

4. The apparatus according to claim 1, wherein the first heating control information contains information about a heat quantity to be applied to the first shot region by the heating unit.

5. The apparatus according to claim 1, wherein the control unit weights the first heating control information according to an elapsed time from when the heating unit performs heating of the first shot region.

6. The apparatus according to claim 1, wherein the control unit weights the first heating control information according to a position on the first shot region in the substrate, which has been heated by the heating unit.

7. The apparatus according to claim 1, wherein the control unit determines the first heating control information based on deformation information about a deformation amount in the second shot region, which is generated by heating of the first shot region based on the first heating control information and remains in imprint processing of the second shot region.

8. The apparatus according to claim 7, wherein the control unit determines the first heating control information using the deformation information so that the shape of the second shot region becomes close to the target shape.

9. The apparatus according to claim 1, wherein the control unit determines the second heating control information based on deformation information about a deformation amount in a third shot region undergoing imprint processing after the second shot region, which is generated by heating of the second shot region based on the second heating control information and remains in imprint processing of the third shot region.

10. The apparatus according to claim 9, wherein the control unit determines the second heating control information using the deformation information so that a shape of the third shot region becomes close to the target shape for the third shot region.

11. The apparatus according to claim 1, further comprising an alignment measurement unit configured to measure a shape difference between a pattern region of the mold and a shot region of the substrate, wherein the control unit causes the alignment measurement unit to measure a shape difference between the pattern region of the mold and the second shot region of the substrate during an imprint processing for the second shot region, wherein in a case where the shape difference between the pattern region of the mold and the second shot region does not fall within a tolerance range, the control unit controls the heating unit so that the shape difference falls within the tolerance range.

12. The apparatus according to claim 1, wherein
the second heating control information is determined based on a deformation amount of the second shot region deformed by heating of the first shot region in accordance with the first heating control information.

13. An imprint apparatus for forming a pattern in first and second shot regions on a substrate by performing, at each of the first and second shot regions, imprint processing of forming the pattern of an imprint material on the substrate using a mold, the apparatus comprising:

a heater configured to deform each of the first and second shot regions by heating the substrate; and a controller configured to control the heater, wherein the controller is configured to obtain first heating control information for controlling heating of the first shot region by the heater and second heating control information for controlling heating of the second shot region by the heater, wherein the second heating control information is set using the first heating control information so that the second shot region becomes close to a target shape by deformation of the second shot region by the heating of the first shot region using the first heating control information and deformation of the second shot region by the heating of the second shot region using the second heating control information, wherein the controller is configured to control heating of the first shot region using the obtained first heating control information and control the imprint processing of the first shot region deformed by the heating of the first shot region, and wherein the controller is configured to control heating of the second shot region using the obtained second heating control information and controls the imprint processing of the second shot region deformed by the heating of the first shot region and the heating of the second shot region.

* * * * *